(12) United States Patent
Ishii (10) Patent No.: US 8,780,236 B2
(45) Date of Patent: Jul. 15, 2014

(54) IMAGING APPARATUS FOR CORRECTING NOISE WHEN A QUANTITY OF PIXELS IN AN INVALID PIXEL AREA IS SMALL

(75) Inventor: Mie Ishii, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 19 days.

(21) Appl. No.: 13/529,252

(22) Filed: Jun. 21, 2012

(65) Prior Publication Data

US 2012/0327280 A1  Dec. 27, 2012

(30) Foreign Application Priority Data

Jun. 24, 2011  (JP) ................................. 2011-140970

(51) Int. Cl.
*H04N 9/64*  (2006.01)
(52) U.S. Cl.
USPC ............................. 348/243; 348/245; 348/246
(58) Field of Classification Search
USPC .................. 348/241–251, 300, 308
See application file for complete search history.

(56) References Cited

U.S. PATENT DOCUMENTS

| | | | |
|---|---|---|---|
| 7,982,784 B2 * | 7/2011 | Oten et al. ..................... | 348/241 |
| 8,130,289 B2 * | 3/2012 | Tu et al. ........................ | 348/243 |
| 8,228,410 B2 * | 7/2012 | Raynor et al. ................ | 348/301 |
| 8,233,066 B2 * | 7/2012 | Zheng et al. .................. | 348/294 |
| 8,269,864 B2 * | 9/2012 | Gerstenberger et al. ...... | 348/243 |
| 2009/0322912 A1 * | 12/2009 | Blanquart ..................... | 348/241 |
| 2010/0053380 A1 * | 3/2010 | Ise ............................... | 348/241 |

FOREIGN PATENT DOCUMENTS

| | | |
|---|---|---|
| JP | 2002-016841 A | 1/2002 |
| JP | 2005-086657 A | 3/2005 |
| JP | 2010-034895 A | 2/2010 |
| JP | 2010-056795 A | 3/2010 |
| KR | 10-2011-0052720 A | 5/2011 |

* cited by examiner

*Primary Examiner* — Kelly L Jerabek
(74) *Attorney, Agent, or Firm* — Canon U.S.A., Inc. IP Division (57) ABSTRACT

Provided is an imaging apparatus including an image sensor. In the image sensor that includes a valid pixel area in which a plurality of valid pixels each having a photoelectric conversion unit is disposed, a first reference pixel area in which a plurality of first reference pixels each having a light-shielded photoelectric conversion unit is disposed, and a second reference pixel area in which a plurality of second reference pixels each having no photoelectric conversion unit is disposed, when outputs of the plurality of valid pixels are added to be read, outputs of the plurality of first reference pixels are added by the addition unit to be read, and outputs of the plurality of second reference pixels are read without being added by the addition unit. Thus, noises can be effectively corrected even in the small number of invalid pixels areas.

7 Claims, 12 Drawing Sheets

|    | 0 | 1 | 2 | 3 | 4 | 5 | 6 | 7 | 8 | 9 | 10 | 11 | 12 | 13 | 14 | 15 | 16 |
|----|---|---|---|---|---|---|---|---|---|---|----|----|----|----|----|----|----|
| 0  |   |   |   |   |   |   |   |   |   |   |    |    |    |    |    |    |    |
| 1  |   |   |   |   |   |   |   |   |   |   |    |    |    |    |    |    |    |
| 2  |   |   |   |   |   |   |   |   |   |   |    |    |    |    |    |    |    |
| 3  |   |   |   |   |   |   |   |   |   |   |    |    |    |    |    |    |    |
| 4  |   |   |   |   |   |   |   |   |   |   |    |    |    |    |    |    |    |
| 5  |   |   |   |   |   |   |   |   |   |   |    |    |    |    |    |    |    |
| 6  |   |   |   |   |   |   |   |   |   |   |    |    |    |    |    |    |    |
| 7  |   |   |   |   |   |   |   |   |   |   |    |    |    |    |    |    |    |
| 8  |   |   |   |   |   |   |   |   |   |   |    |    |    |    |    |    |    |
| 9  |   |   |   |   |   |   |   |   |   |   |    |    |    |    |    |    |    |
| 10 |   |   |   |   |   |   |   |   |   |   |    |    |    |    |    |    |    |
| 11 |   |   |   |   |   |   |   |   |   |   |    |    |    |    |    |    |    |
| 12 |   |   |   |   |   |   |   |   |   |   |    |    |    |    |    |    |    |
| 13 |   |   |   |   |   |   |   |   |   |   |    |    |    |    |    |    |    |
| 14 |   |   |   |   |   |   |   |   |   |   |    |    |    |    |    |    |    |
| 15 |   |   |   |   |   |   |   |   |   |   |    |    |    |    |    |    |    |
| 16 | R | G | R | G | R | G | R | G | R | G | R  | G  | R  | G  | R  | G  | R  |
| 17 | G | B | G | B | G | B | G | B | G | B | G  | B  | G  | B  | G  | B  | G  |
| 18 | R | G | R | G | R | G | R | G | R | G | R  | G  | R  | G  | R  | G  | R  |
| 19 | G | B | G | B | G | B | G | B | G | B | G  | B  | G  | B  | G  | B  | G  |
| 20 | R | G | R | G | R | G | R | G | R | G | R  | G  | R  | G  | R  | G  | R  |
| 21 | G | B | G | B | G | B | G | B | G | B | G  | B  | G  | B  | G  | B  | G  |
| 22 | R | G | R | G | R | G | R | G | R | G | R  | G  | R  | G  | R  | G  | R  |
| 23 | G | B | G | B | G | B | G | B | G | B | G  | B  | G  | B  | G  | B  | G  |
| 24 | R | G | R | G | R | G | R | G | R | G | R  | G  | R  | G  | R  | G  | R  |
| 25 | G | B | G | B | G | B | G | B | G | B | G  | B  | G  | B  | G  | B  | G  |
| 26 | R | G | R | G | R | G | R | G | R | G | R  | G  | R  | G  | R  | G  | R  |
| 27 | G | B | G | B | G | B | G | B | G | B | G  | B  | G  | B  | G  | B  | G  |
| 28 | R | G | R | G | R | G | R | G | R | G | R  | G  | R  | G  | R  | G  | R  |
| 29 | G | B | G | B | G | B | G | B | G | B | G  | B  | G  | B  | G  | B  | G  |

Prior Art

FIG.11

Prior Art

FIG.12

IMAGING APPARATUS FOR CORRECTING NOISE WHEN A QUANTITY OF PIXELS IN AN INVALID PIXEL AREA IS SMALL

BACKGROUND OF THE INVENTION

1. Field of the Invention

The present invention relates to an imaging apparatus that includes an image sensor.

2. Description of the Related Art

Recently, a complementary metal-oxide semiconductor (CMOS) image sensor has been often used for a digital camera or a video camera. However, various noises are generated in the CMOS image sensor. For example, a dark current noise, a fixed pattern noise due to a reading circuit, or a pixel defect due to a very small flaw unique to the image sensor causes image quality deterioration.

Figure 11:
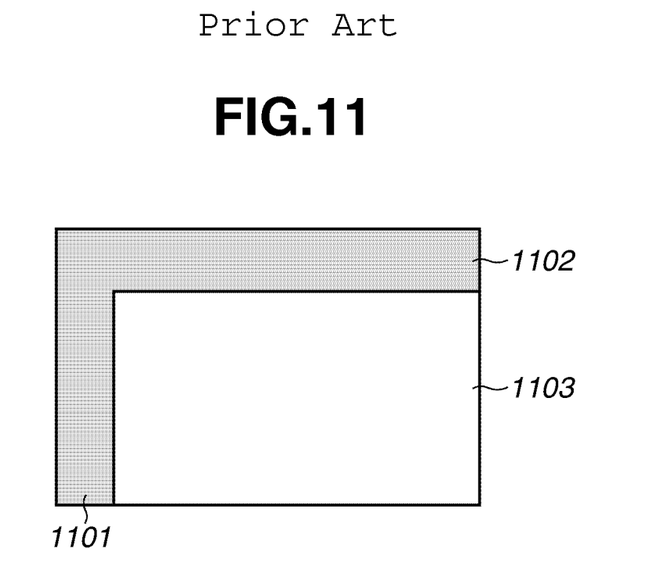
FIG. 11 illustrates a configuration example of a conventional pixel area.

As a countermeasure, there has been offered a method for setting a light-shielded invalid pixel area in the image sensor, and carrying out an arithmetic operation for a pixel signal of a valid pixel area by using a signal obtained by averaging pixel signals of the invalid pixel area. FIG. 11 illustrates an example of a configuration of a pixel area of the CMOS image sensor. The CMOS image sensor includes an invalid pixel area that includes a horizontal optical black (HOP) pixel area 1101 and a vertical optical black (VOB) pixel area 1102, and a valid pixel area 1103.

Figure 12:
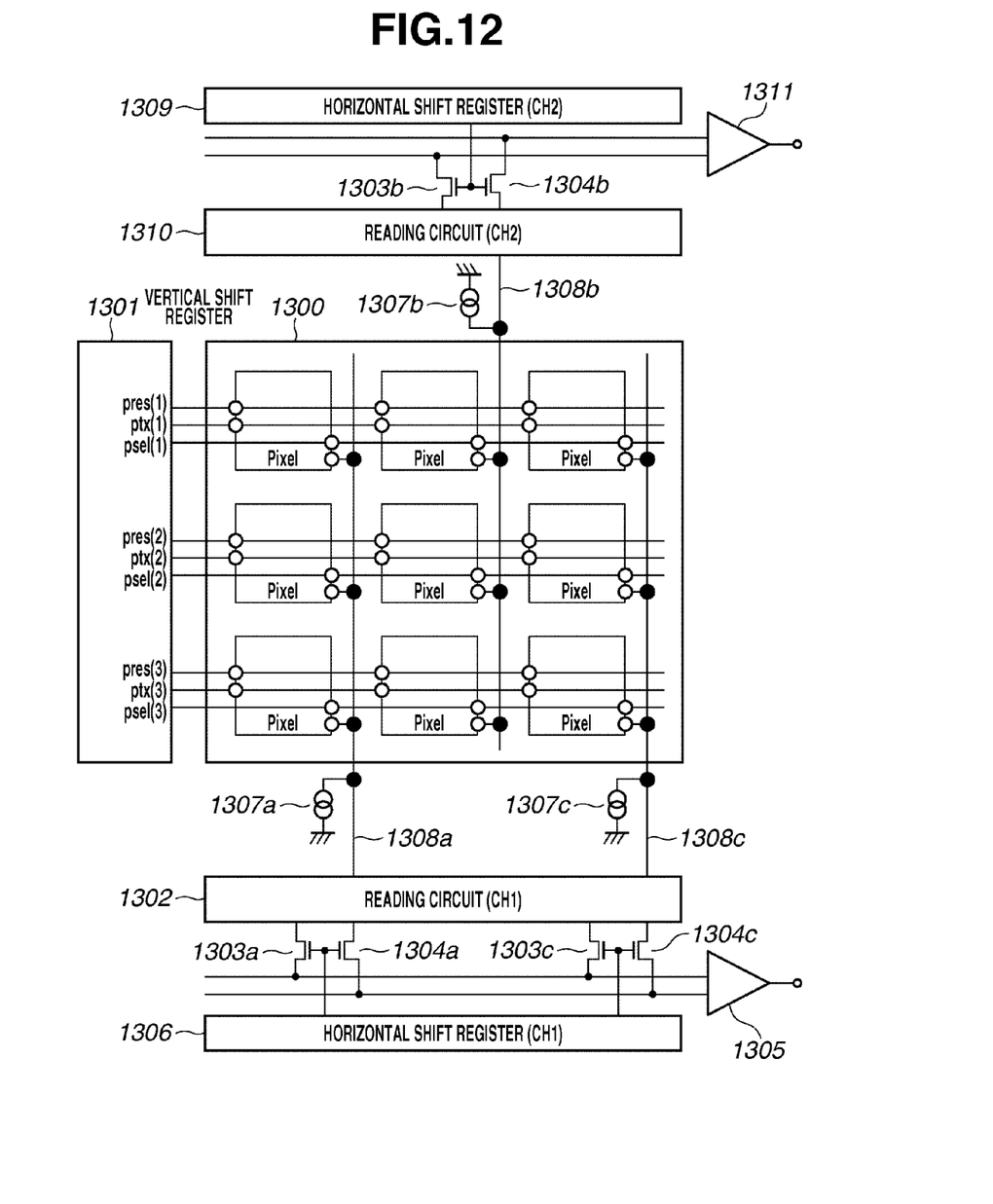
FIG. 12 illustrates a configuration of a conventional image sensor.

FIG. 12 is a block diagram illustrating a layout configuration example of the CMOS image sensor. To simplify the description, only nine pixels of 3×3 are shown. In reality, the configuration includes several millions of pixels or more. A vertical shift register 1301 outputs a signal of a row selection line Pres1, Ptx, and Psell to a pixel area 1300. Pixel signals generated at pixels of an odd column of the pixel area 1300 are output to vertical signal lines 1308a and 1308c. Pixel signals generated at pixels of an even column are output to a vertical signal line 1308b. Current sources 1307a to 1307c are connected as loads to the respective vertical signal lines 1308a to 1308c.

Charge signals output to the vertical signal lines 1308a to 1308c are input to reading circuits 1302 and 1310 respectively corresponding to a channel 1 (CH 1) and a channel 2 (CH 2). Pixel signals of the respective channels are output to differential amplifiers 1305 and 1311 via n channel metal-oxide semiconductor (MOS) transistors 1303a to 1303c. Noise signals of the respective channels are output to the differential amplifiers 1305 and 1311 via n channel metal-oxide semiconductor (MOS) transistors 1304a to 1304c.

Horizontal shift registers 1306 and 1309 control turning on/off of the transistors 1303a to 1303c and 1304a to 1304c. The differential amplifiers 1305 and 1311 output differences between pixel signals and noise signals. The acquisition of such a difference between the pixel signal and the noise signal enables to acquire an output signal where a noise unique to the CMOS image sensor has been removed.

When there is a variation in characteristics between the current sources connected as the loads to the vertical signal lines or the reading circuits of the respective channels, a level difference almost uniform for each column is generated to appear as a streak-shaped pattern noise extending in a vertical direction (in a column direction). The streak-shaped pattern noise extending in the vertical direction (in the column direction) is a noise unique to the column due to a characteristic variation of paths of a vertical output line and after, and hence it can be corrected by using a signal of the VOB pixel illustrated in FIG. 11. Specifically, Japanese Patent Application Laid-Open No. 2002-016841 discusses a method for canceling a fixed pattern noise by using correction data generated based on output signals from the VOB pixels of a plurality of rows. When the streak-shaped pattern noise extending in the vertical direction (in the column direction) is corrected by the correction method described above, to improve reliability of a correction signal by reducing the influence of a random noise or a flaw pixel signal, a certain number of rows of VOB pixels must be provided.

To achieve low pixelation for image data, pixel addition processing is carried out in the vertical direction (in the column direction) in the image sensor. For the pixel addition processing, Japanese Patent Application Laid-Open No. 2005-86657 discusses a method in which addition is performed at a capacity unit of a column reading circuit, and Japanese Patent Application Laid-Open No. 2010-34895 discusses a method in which addition is performed in a floating diffusion (FD) region connected to a photoelectric conversion unit.

When the pixel addition processing is carried out in the vertical direction (in the column direction), pixel addition processing must be executed in the invalid pixel area including the VOB pixel as in the case of the valid pixel area. Particularly, when the pixel addition is executed in the FD region, because of a difference in FD capacity between the time of addition driving and the time of non-addition driving, a signal level of a dark current included in the charge signal varies between the time of addition driving and the time of non-addition driving. As a result, unless the pixel addition processing is executed in the invalid pixel area as in the case of the valid pixel area to generate a correction signal, correct correction processing cannot be carried out.

Further, to calculate highly reliable correction data even when the pixel addition processing is executed, more pixels must be provided, creating a problem of an increase of a chip area.

SUMMARY OF THE INVENTION

The present invention is directed to an imaging apparatus that can effectively correct, even in an image sensor having a pixel addition processing function, a fixed pattern noise or a dark current noise in a vertical direction (in a column direction) even with a configuration where the number of pixels is small in an invalid pixel area.

According to an aspect of the present invention, an imaging apparatus includes an image sensor including a pixel array including a valid pixel area in which a plurality of valid pixels each having a photoelectric conversion unit is disposed, a first reference pixel area in which a plurality of first reference pixels each having a light-shielded photoelectric conversion unit is disposed, a second reference pixel area in which a plurality of second reference pixels each having no photoelectric conversion unit is disposed, and a plurality of pixels arranged in a row direction and in a column direction, and an addition unit configured to add outputs of the plurality of pixels. The addition unit is configured, when the addition unit adds the outputs of the plurality of the valid pixels to read, to add the outputs of the plurality of the first reference pixels to read, and not to add the outputs of the plurality of the second reference pixels to read.

According to another aspect of the present invention, there is provided a method for controlling an imaging apparatus including an image sensor that includes a pixel array including a valid pixel area in which a plurality of valid pixels each having a photoelectric conversion unit is disposed, a first reference pixel area in which a plurality of first reference pixels each having a light-shielded photoelectric conversion unit is disposed, a second reference pixel area in which a plurality of second reference pixels each having no photoelectric conversion unit is disposed, and a plurality of pixels arranged in a row direction and in a column direction, and an addition unit configured to add outputs of the plurality of pixels. The method includes adding, when the addition unit adds the outputs of the plurality of the valid pixels to read, outputs of the plurality of the first reference pixels by the addition unit to read the outputs, and reading outputs of the plurality of the second reference pixels without adding the outputs by the addition unit.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

DESCRIPTION OF THE EMBODIMENTS

Various exemplary embodiments, features, and aspects of the invention will be described in detail below with reference to the drawings.

Figure 1:
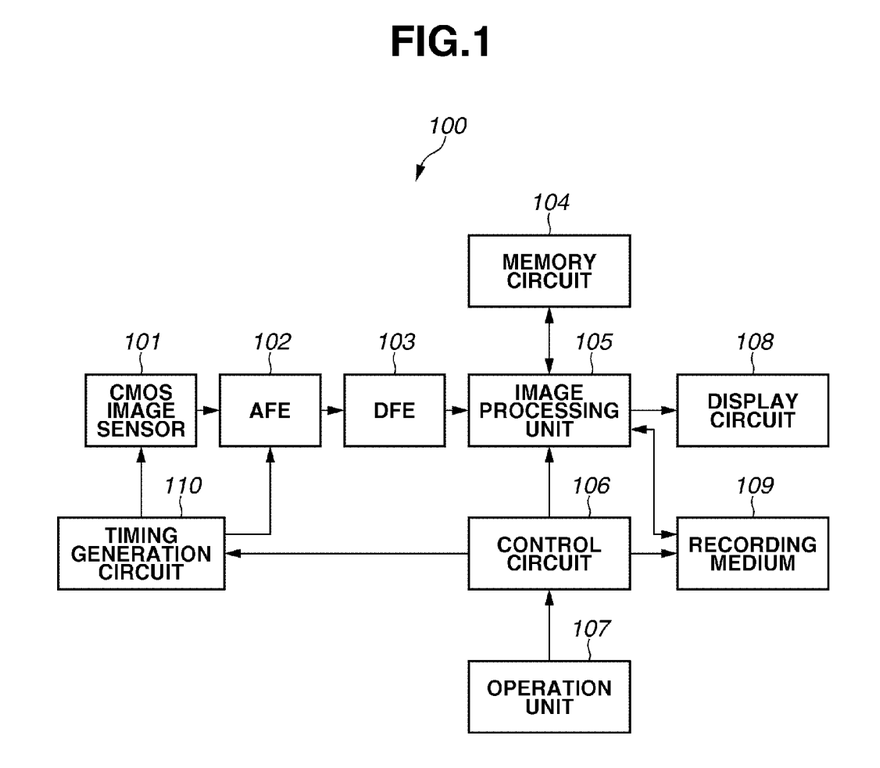
FIG. 1 is a block diagram illustrating an imaging apparatus according to a first exemplary embodiment of the present invention.

A first exemplary embodiment will be described. FIG. 1 is a block diagram illustrating an overall configuration of an imaging apparatus according to the first exemplary embodiment of the present invention. In FIG. 1, a CMOS image sensor 101 photoelectrically converts an object image formed by a photographic lens (not illustrated) to output an electric signal. An analog front end (AFE) 102 executes signal processing such as amplification or black level adjustment (optical black (OB) clamping) of the electric signal output from the CMOS image sensor 101. The AFE 102 converts an analog signal processed based on OB clamp timing or an OB clamp target level output from a timing generation circuit 110 into a digital signal. A digital front end (DFE) 103 receives the digital signal of each pixel converted by the AFE 102 to execute digital processing such as image signal correction or pixel rearrangement.

An image processing unit 105 executes processing such as displaying of an image on a display circuit 108 by development or recording of the image in a recording medium 109 via a control circuit 106. A compact flash (registered trademark) memory is used for the recording medium 109. A memory circuit 104 is used as a work memory at a development stage of the image processing unit 105 or as a buffer memory when the processing is not in time for development because photographing is followingly carried out.

The control circuit 106 controls the entire imaging apparatus and receives an instruction from an operation unit 107 to transmit a command to each unit. The operation unit 107 includes a power switch for activating the imaging apparatus and a shutter switch. When an operator operates the shutter switch, under control of the control circuit 106, start of a photographing preparation operation such as photometry or focusing control is instructed. Then a series of photographing operations such as driving the mirror or the shutter, processing of a signal read from the image sensor 101, and writing the signal in the recording medium 109 is carried out.

Figure 2:
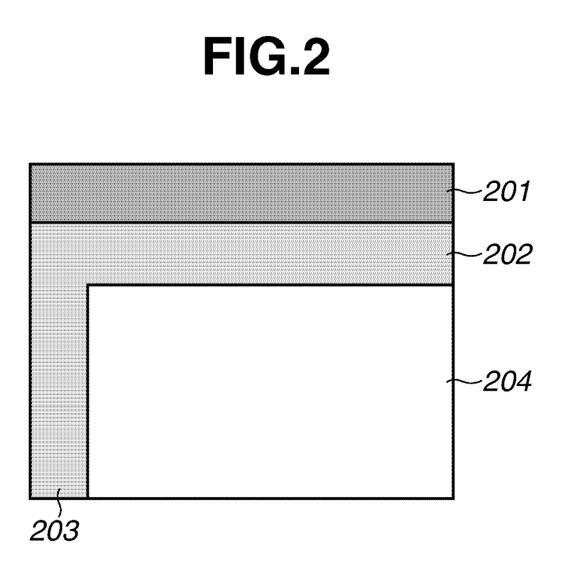
FIG. 2 illustrates a configuration example of a pixel area according to the first exemplary embodiment of the present invention.

FIG. 2 illustrates a configuration example of a pixel arrangement of the CMOS image sensor 101. As illustrated in FIG. 2, the image sensor according to the exemplary embodiment includes a pixel arrangement including a valid pixel area 204 and an invalid pixel area where a plurality of pixels are arranged in a row direction and in a column direction.

The invalid pixel area includes a horizontal optical black (HOB) pixel area 203 and a vertical optical black (VOB) pixel area 202 (first reference pixel area) where a plurality of OB pixels (first reference pixels) having light-shielded photoelectric conversion units are arranged, and a NULL pixel area 201 (second reference pixel area) where a plurality of NULL pixels (second reference pixels, dummy pixels) having no photoelectric conversion unit are arranged.

Each pixel (valid pixel) of the valid pixel area 204 stores charges generated at the photoelectric conversion unit according to incident light, and converts the charges into pixel signals to output thereof. The HOB pixel area 203 is a light shielding area located adjacently to the left side of the valid pixel area 204 in a horizontal direction (in a row direction). The VOB pixel area 202 is a light shielding area located adjacently to the upper side of the valid pixel area 204 in a vertical direction (in a column direction).

The valid pixel area 204 and the HOB pixel area 203 and the VOB pixel area 202 are similar in pixel structure. The photoelectric conversion unit of the valid pixel area 204 is not shielded from light, while the photoelectric conversion units of the HOB pixel area 203 and the VOB pixel area 202 are shielded from light. The NULL pixel area 201 is located adjacently to the upper side of the VOB pixel area 202 in the vertical direction (in column direction). The NULL pixel does not need to be shielded from light because it has no photoelectric conversion unit.

Figure 3:
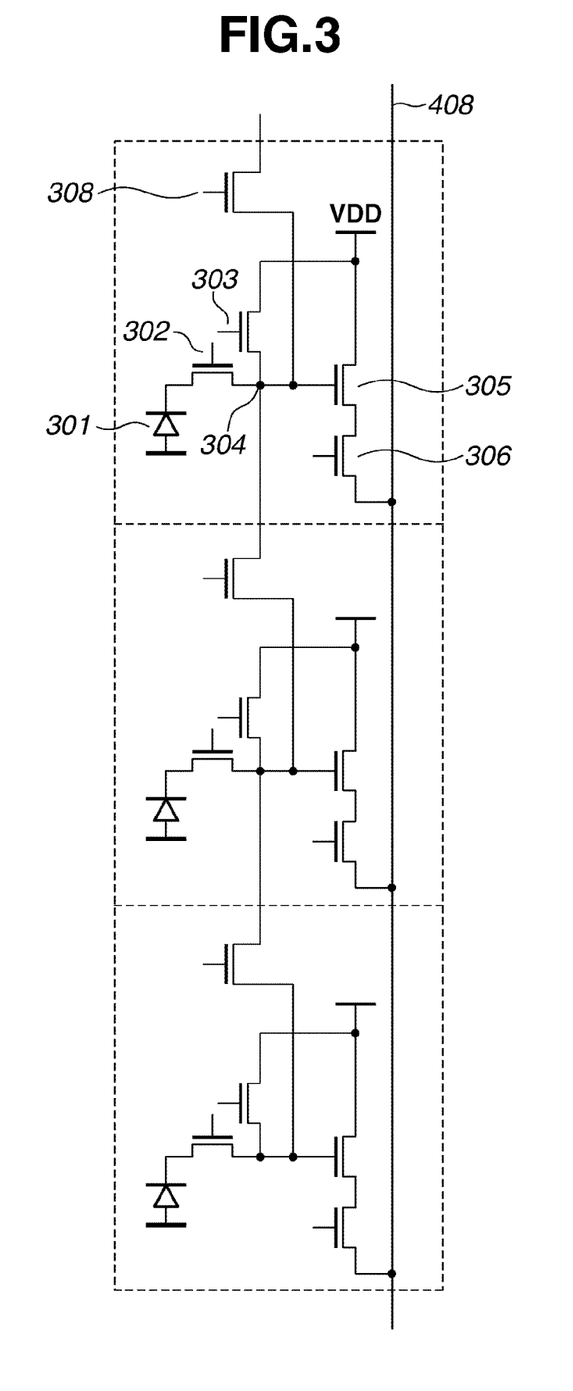
FIG. 3 illustrates a circuit configuration example of an image sensor according to the first exemplary embodiment of the present invention.

FIG. 3 illustrates a circuit configuration of a valid pixel constituting the CMOS image sensor 101. A photodiode (PD)

301 that is a photoelectric conversion unit receives an optical image formed by the photographic lens (not illustrated), and generates charges by photoelectric conversion to store thereof. A transfer switch 302 that includes a MOS transistor transfers the charges stored in the PD 301 to a floating diffusion area (FD) 304.

The FD 304 converts the charges transferred from the PD 301 by the transfer switch 302 into a voltage, and a source follower amplifier (SF) 305 outputs a signal according to the voltage converted at the FD area 304. A selection switch 306 outputs a pixel signal output from the SF 305 to a vertical output line (column output line) 408. A reset switch 303 resets a potential of the FD 304 to a reset power supply voltage VDD, and also resets a potential of the PD 301 to a reset power supply voltage VDD via the transfer switch 302.

The CMOS image sensor 101 according to the exemplary embodiment includes an addition switch 308 that is an addition unit. By turning on the addition switch 308, the charges generated at the PDs 301 adjacent to each other in the vertical direction (in the column direction) are added together at the FD 304. As an example, a circuit that adds charges of the three pixels adjacent to one another in the vertical direction to output the result is illustrated. However, the number of pixels charges of which are added together is not limited to three.

The OB pixels arranged in the HOB pixel area and the VOB pixel area are similar in circuit configuration to the valid pixel illustrated in FIG. 3. The NULL pixel has a configuration where the PD 301 serving as the photoelectric conversion unit and the addition unit 308 are removed from the circuit configuration of the valid pixel illustrated in FIG. 3. Alternatively, the NULL pixel can include the addition switch 308.

Figure 4:
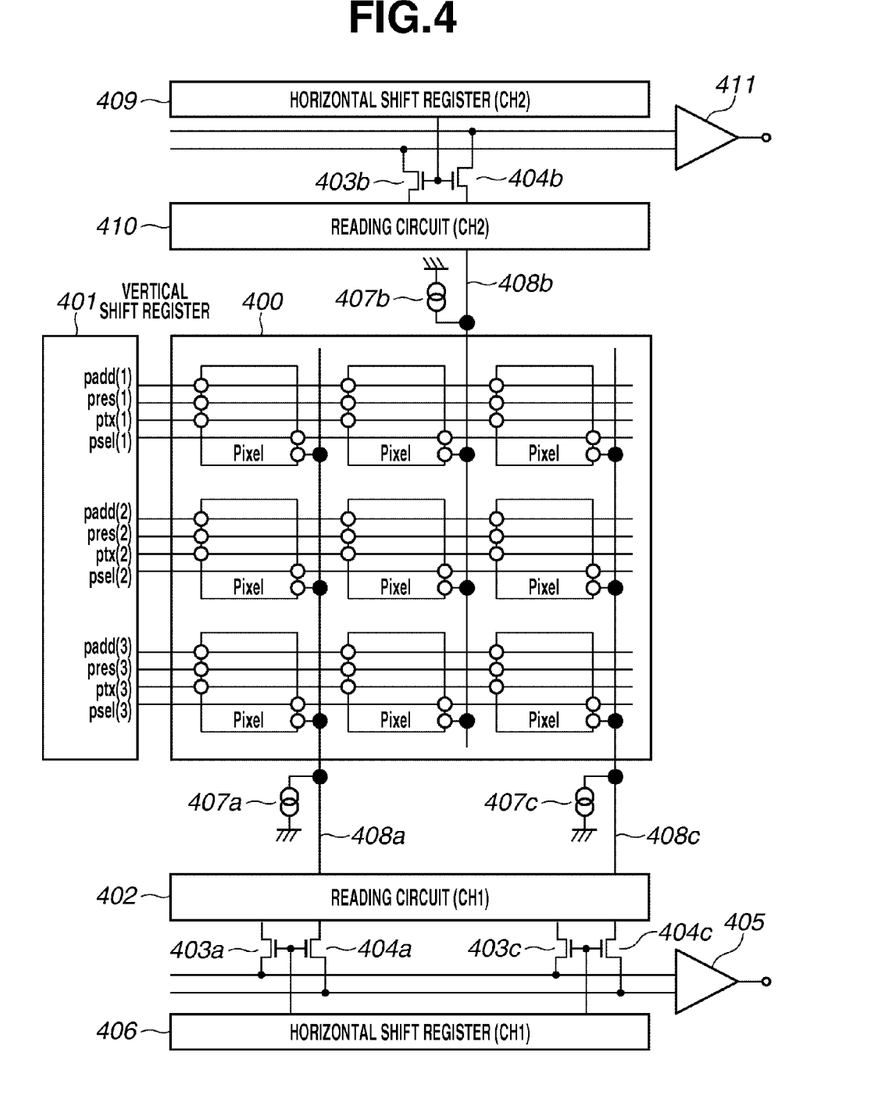
FIG. 4 illustrates a configuration example of the image sensor according to the first exemplary embodiment of the present invention.

FIG. 4 is a block diagram illustrating a configuration example of the CMOS image sensor 101. A vertical shift register 401 outputs a driving signal to a pixel area 400 via row selection lines Pres (1) to (3), Ptx (1) to (3), Psel (1) to (3), and Padd (1) to (3).

A pixel array 400 includes a plurality of pixels, each of which has a circuit configuration illustrated in FIG. 3. Although FIG. 4 illustrates the configuration of 3×3 pixels for simplicity, normally, several hundreds of pixels or more are included. The respective pixels output noise signals and pixel signals to vertical signal lines (column signal lines) 408a to 408c corresponding to the CH 1 and the CH 2 at an even column and an odd column. Constant current sources 407a to 407c are respectively connected as loads to the vertical signal lines 408a to 408c.

The pixel signals and the noise signals are input from the vertical signal lines 408a to 408c to reading circuits 402 and 410. The reading circuit 402 and 410 output the input pixel signals to differential amplifiers 405 and 411 via n channel transistors 404a to 404c. The reading circuit 402 and 410 output the input noise signals to differential amplifiers 405 and 411 via n channel transistors 403a to 403c. Horizontal shift registers 406 and 409 control turning on/off of the transistors 403a to 403c and 404a to 404c. The differential amplifiers 405 and 411 output differences between the pixel signals and the noise signals.

A gate of the transfer switch 302 illustrated in FIG. 3 is connected to the first row selection line Ptx (1) illustrated in FIG. 4. Gates of the transfer switches 302 of the other pixels arranged at the same row are commonly connected to the first row selection line Ptx (1). A gate of the reset switch 303 illustrated in FIG. 3 is connected to the second row selection line Pres (1) illustrated in FIG. 4. Gates of the reset switches 303 of the other pixels arranged at the same row are commonly connected to the second row selection line Pres (1).

A gate of the selection switch 306 illustrated in FIG. 3 is connected to the third row selection line Psel (1) illustrated in FIG. 4. Gates of the selection switches 306 of the other pixels arranged at the same row are commonly connected to the third row selection line Psel (1). A source of the selection switch 306 is connected to the vertical signal lines 408a to 408c. A gate of the addition switch 308 illustrated in FIG. 3 is connected to the fourth row selection line Padd (1) illustrated in FIG. 4. Gates of the addition switches 308 of the other pixels arranged at the same row are connected to the fourth row selection line Padd (1).

Each driving signal is output to these first to fourth row selection lines Ptx (1), Pres (1), Psel (1), and Padd (1) by the vertical shift register 401. At the remaining lines illustrated in FIG. 4, pixels and row selection lines of similar configurations are arranged. Driving signals are also supplied to these row selection lines Ptx (2) and Ptx (3), Pres (2) and Pres (3), Psel (2) and Pres1 (3), and Padd (2) and Padd (3) by the vertical shift register 401.

Figure 5:
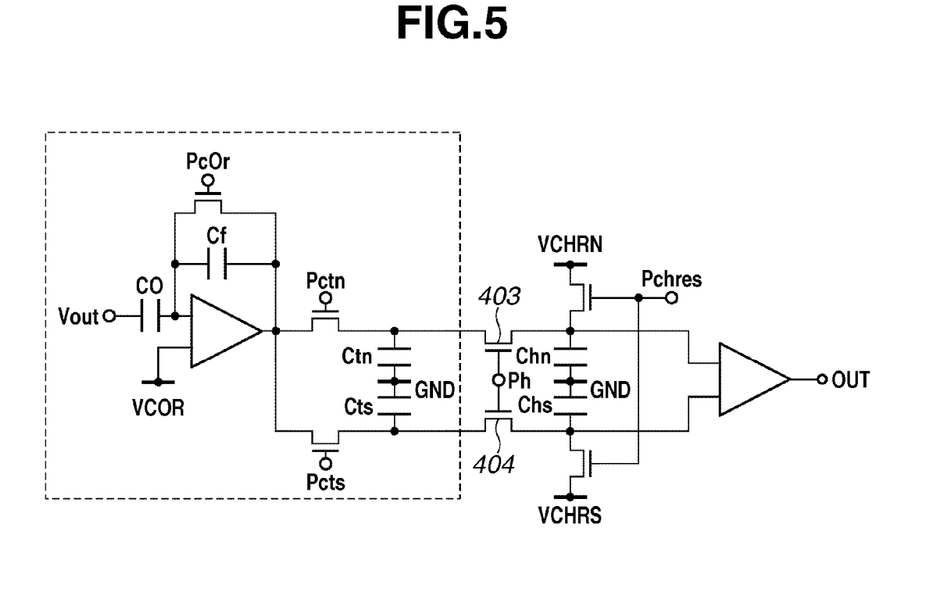
FIG. 5 illustrates a configuration example of a reading circuit according to the first exemplary embodiment of the present invention.
Figure 6:
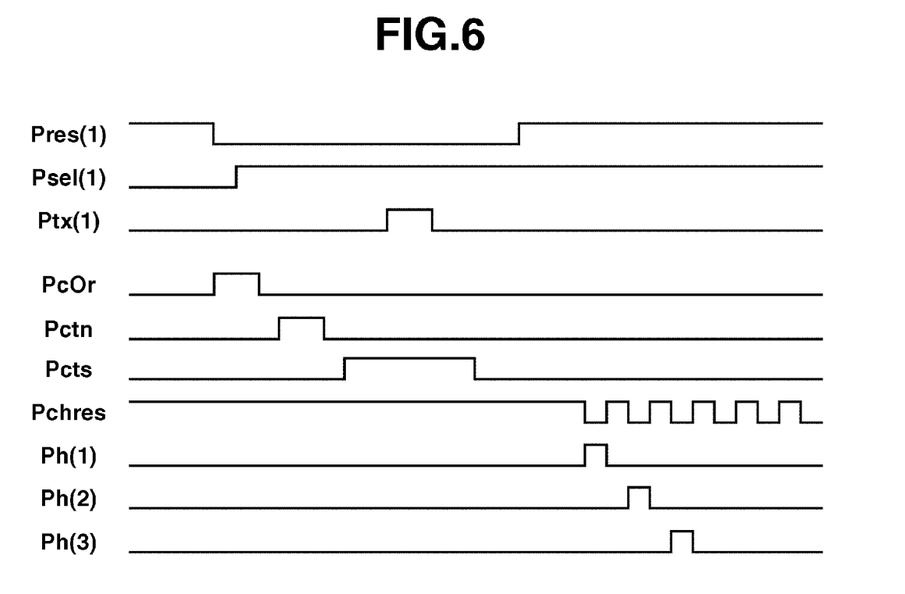
FIG. 6 is a driving timing chart of the image sensor according to the first exemplary embodiment of the present invention.

FIG. 5 illustrates a circuit example of each of the reading circuits 402 and 410 illustrated in FIG. 4. A portion surrounded with a broken line is a block equivalent to one column. Each of the vertical signal lines 408a to 408c illustrated in FIG. 4 are connected to a terminal Vout illustrated in FIG. 5. FIG. 6 is a timing chart illustrating an operation example of the CMOS image sensor 101. Referring to FIGS. 3, 5, and 6, the operation of the CMOS image sensor 101 will be described.

Before reading of charges from the PD 301, the second row selection line Pres (1) connected to the gate of the reset switch 303 is set to a high level. This resets the gate of the SF 305 to a reset power supply voltage VDD. Upon the second row selection line Pres (1) connected to the gate of the reset switch 303 is set to a low level, simultaneously, gate lines PcOr of the clamping switches of the reading circuits 402 and 410 are set to a high level. Then, the third row selection line Psel (1) connected to the gate of the selection switch 306 is set to a high level.

Accordingly, a reset signal (noise signal) where a reset noise has been superimposed is read from the vertical signal lines 408a to 408c to the terminals Vout of the reading circuits 402 and 410 illustrated in FIG. 5, and clamped to a clamping capacity C0 of each column. Then, after the gate line PcOr of the clamping switch is set to a low level, a gate line Pctn of the noise signal side transfer switch is set to a high level, thus holding a rest signal at a noise holding capacity Ctn of each column.

Then, after a gate line Pcts of the pixel signal side transfer switch is set to a high level, the first row selection line Ptx (1) connected to the gate of the transfer switch 302 is set to a high level, and charges of the PD 301 are transferred to the gate of the SF 305. Simultaneously, charge signals are read from the vertical signal lines 408a to 408c to the terminals Vout of the reading circuits 402 and 410.

Then, after the first row selection line Ptx (1) connected to the gate of the transfer switch 302 is set to a low level, the gate line Pcts of the pixel signal side transfer switch is set to a low level. An optical signal component (pixel signal) equivalent to a change from the reset signal is then read to be held at a signal holding capacity Cts of each column. Through this operation, the noise signal and the pixel signal of the pixel connected to the first row are respectively held at the noise holding capacity Ctn and the signal holding capacity Cts connected to each column.

Further, by signals Ph supplied from the horizontal shift registers 406 and 409, horizontal transfer switch gates 403 and 404 of each column are sequentially set to a high level.

Then, voltages held at the noise holding capacity Ctn and the signal holding capacity Cts are sequentially read to holding capacities Chn and Chs of the horizontal output lines, and subjected to difference processing at the differential amplifier to be sequentially output to the output terminal OUT.

Between signal reading of each of the columns, a reset signal Pchres for turning on the reset switch is set to a high level, and the holding capacities Chn and Chs of the horizontal output lines are respectively reset to reset voltages VCHRN and VCHRS. This completes signal reading from the pixel connected to the first row. Similarly, signals of pixels connected to the second row and after are sequentially read by a driving signal from the vertical shift register 401, thus completing reading of all the pixels.

Figure 7:
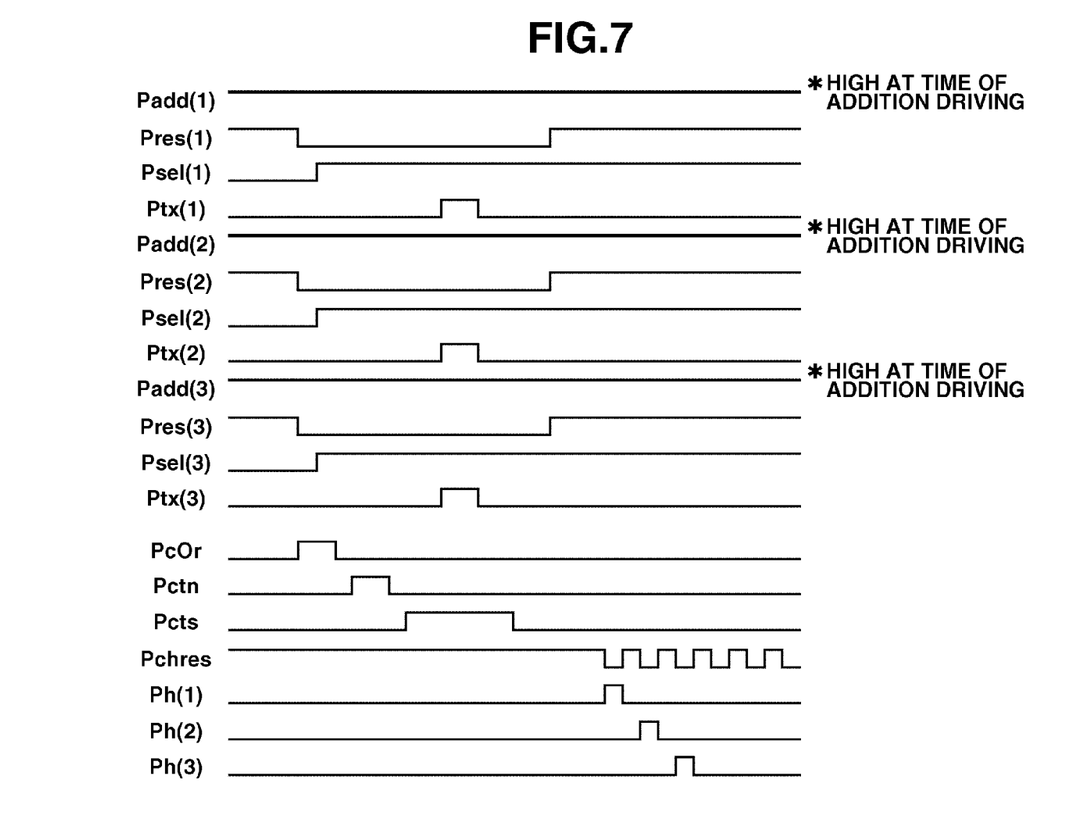
FIG. 7 is a driving timing chart of a vertical pixel addition of the image sensor according to the first exemplary embodiment of the present invention.

FIG. 7 is a timing chart illustrating an operation example of addition driving where charges generated in the PDs 301 of the adjacent pixels are added together at the FD area 304 by turning on the addition switch 308 of the CMOS image sensor 101. As an example, an addition driving method for adding together charges of the three pixels in the vertical direction in the CMOS image sensor 101 illustrated in the block diagram of FIG. 4 will be described.

First, during charge reading from the PD 301, the Padd (1), the Padd (2), and Padd (3) are set to a high level. Before the charge reading from the PD 301, the second row selection lines Pres (1), Press (2), and Press (3) connected to the gate of the reset switch 303 are set to a high level. This resets the gate of the SF 305 to a reset power supply voltage VDD.

Upon the second row selection lines Pres (1), Press (2), and Press (3) connected to the gate of the reset switch 303 are set to a low level, simultaneously, the gate lines PcOr of the clamping switches of the reading circuits 402 and 410 are set to a high level. Then, the third row selection lines Psel (1), Psel (2), and Psel (3) connected to the gate of the selection switch 306 are set to a high level. Accordingly, a reset signal (noise signal) where a reset noise has been superimposed is read from the vertical signal lines 408a to 408c to the terminals Vout of the reading circuits 402 and 410 illustrated in FIG. 5, and clamped to a clamping capacity C0 of each column.

Then, after the gate line PcOr of the clamping switch is set to a low level, a gate line Pctn of the noise signal side transfer switch is set to a high level, thus holding a rest signal at a noise holding capacity Ctn of each column.

Then, after a gate line Pcts of the pixel signal side transfer switch is set to a high level, the first row selection lines Ptx (1), Ptx (2), and Ptx (3) connected to the gate of the transfer switch 302 are set to a high level. Charges of the PDs 301 of the three lines are then added together at the FD 304 to be transferred to the gate of the SF 305. Simultaneously, charge signals are read from the vertical signal lines 408a to 408c to the terminals Vout of the reading circuits 402 and 410.

Then, after the first row selection lines Ptx (1), Ptx (2), and Ptx (3) connected to the gate of the transfer switch 302 are set to a low level, the gate line Pcts of the pixel signal side transfer switch is set to a low level. An optical signal component (pixel signal) equivalent to a change from the reset signal is then read to be held at a signal holding capacity Cts of each column. Through this operation, the noise signals and the added pixel signals of the pixels connected to the first row, the second row, and the third row are respectively held at the noise holding capacity Ctn and the signal holding capacity Cts connected to each column.

Further, by signals Ph supplied from the horizontal shift registers 406 and 409, the horizontal transfer switch gates 403 and 404 of each column are sequentially set to a high level. Then, voltages held at the noise holding capacity Ctn and the signal holding capacity Cts are sequentially read to holding capacities Chn and Chs of the horizontal output lines, and subjected to difference processing at the differential amplifier to be sequentially output to the output terminal OUT.

Between signal reading of each of the columns, a reset signal Pchres for turning on the resent switch is set to a high level, and the holding capacities Chn and Chs of the horizontal output lines are respectively reset to reset voltages VCHRN and VCHRS. This completes vertical addition reading from the pixels connected to the first row, the second row, and the third row.

Figure 8:
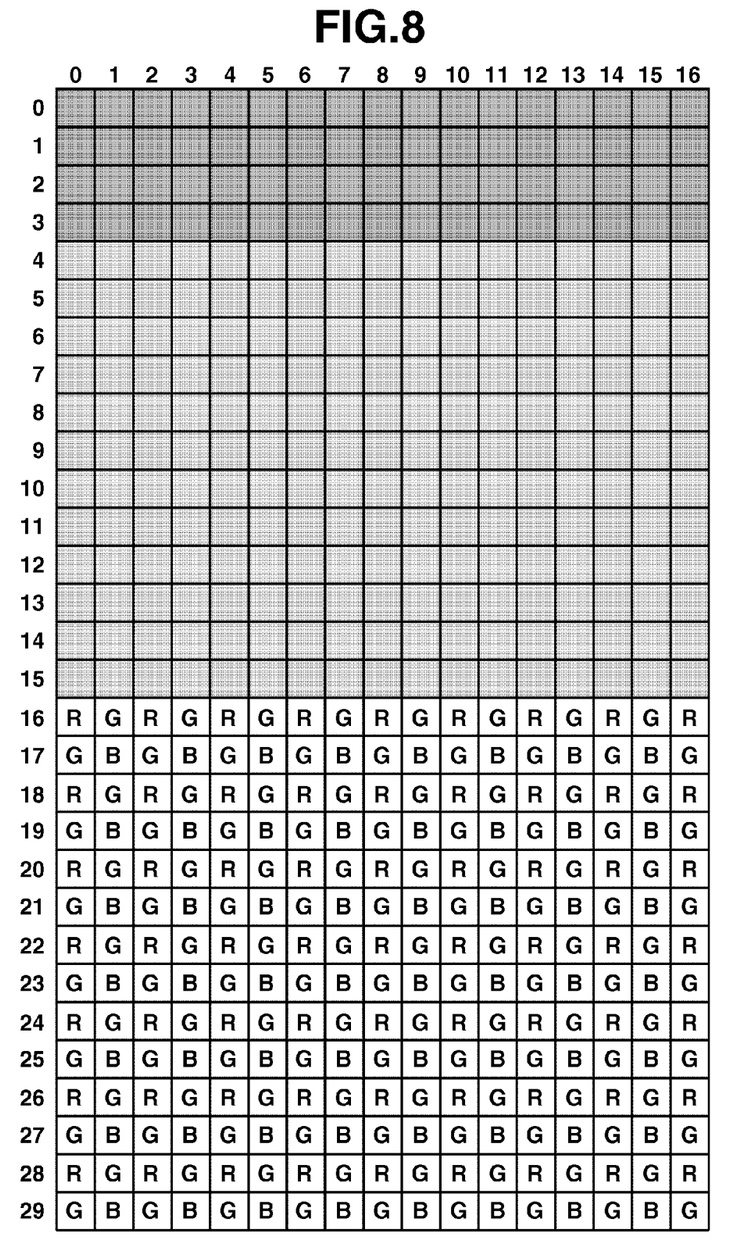
FIG. 8 illustrates a pixel layout of the image sensor according to the first exemplary embodiment of the present invention.
Figure 9:
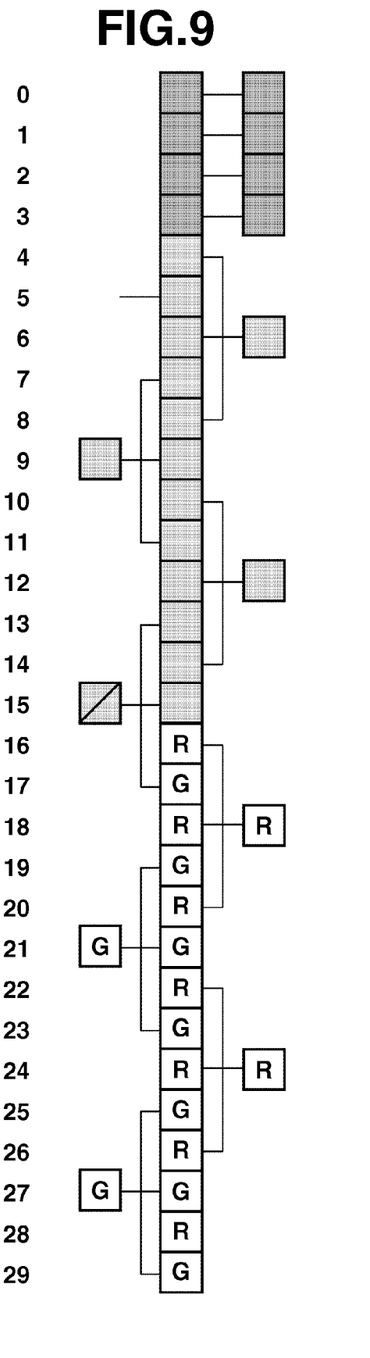
FIG. 9 illustrates pixel reading in a driving method according to the first exemplary embodiment of the present invention.

Referring to FIGS. 8 and 9, a driving method for executing vertical pixel addition by using the CMOS image sensor 101 to acquire an image will be described in detail. FIG. 8 illustrates a part of a pixel layout of the image sensor. FIG. 8 illustrates an example of 17×30 pixels for simpler description. In reality, there are multiple pixels of several thousands× several thousands. In the example illustrated in FIG. 8, 0th to 3rd rows are NULL pixels (dummy pixels), 4th to 15th rows are VOB pixels, and 16th to 29th rows are valid pixels. In the valid pixel, G, R, and B color filters are arranged in a Bayer pattern. In this embodiment, a case where outputs of three pixels of identical colors adjacent to one another in the vertical direction (in the column direction) are added together will be described.

FIG. 9 illustrates vertical addition reading of pixels of a certain column in the pixel layout illustrated in FIG. 8. The NULL pixel (dummy pixel), which is provided to acquire a signal output that serves as a black level reference, includes neither PD 301 nor addition switch 308 illustrated in FIG. 3. Accordingly, outputs of the NULL pixels (dummy pixels) are not added together in the vertical direction, while signals of the pixels of the respective rows are separately read.

Concerning an output of the valid pixel, output of the three pixels of identical colors adjacent to one another in the vertical direction (in the column direction) are added together to be read. FIG. 9 illustrates an R and G column. For R pixels, outputs of three pixels of 16th, 18th, and 20th rows are added together to be read. For G pixels, outputs of three pixels of 19th, 21st, and 23rd rows are added together to be read. Outputs are similarly read for the valid pixels thereafter.

Concerning an output of the VOB pixel, as in the case of the valid pixel, outputs of three pixels in the vertical direction are added to be read. The VOB pixel has no color distinction because it is a light-shielded pixel. However, it is desired that driving is executed to add outputs by the same rule as that of the valid pixel. Specifically, in FIG. 9, outputs of pixels of 4th, 6th, and 8th rows of the VOB pixel area are added together to be read, and outputs of pixels of 1st, 9th, and 11th pixels are added together to be read. Such addition enables acquisition of an OB pixel output without making a center of gravity eccentric. On a boundary between the VOB pixel and the valid pixel, outputs of two VOB pixels of 13th and 15th rows and an output of one pixel (G pixel) of the valid pixel of a 17th row are added together to be read. However, it is desired that this output signal is not be used for image creation.

Then, the DFE 103 corrects the output signal of the valid pixel by using the output signal of the NULL pixel (dummy pixel) and the output signal of the VOB pixel thus read. Hereinafter, the correction processing will be described. It is desired that the correction processing is executed at the DFE 103. However, it can be executed at the image processing apparatus 105.

First, an average value is calculated among the output signals of the NULL pixels of each column. The average value among the output signals of the NULL pixels is subtracted from output pixel signals of respective colors from the valid pixels of the same column. This subtraction enables real-time correction of a vertical-striped noise or shading caused by characteristics of the reading circuit. To achieve highly reliable correction processing, the larger the number of parameters (number of rows) of the NULL pixel, the better. However, as described above, the output signals of the NULL pixels are not added together even when the outputs of the valid pixels are added together to be read. Thus, without increasing the number of rows for the NULL pixel, a NULL pixel output of a number of parameters sufficient for calculation of a correction value (average value) can be acquired.

Usually, when the charges are stored by the PD that is a photoelectric conversion unit, a dark current noise is generated according to the storage time or an environmental temperature. However, since PD serving as a photoelectric conversion unit is not disposed in the NULL pixel (dummy pixel), dark current noise is not generated. As a result, a desired correction value can be acquired without executing any addition reading, and a fixed pattern noise generated for each column can be accurately corrected.

The dark current noise generated in the valid pixel is corrected by using the output signal of the VOB pixel. As described above, the dark current noise depends on the charge storage time and the environmental temperature. In the VOB pixel, as in the case of the valid pixel, a PD that is a photoelectric conversion unit is disposed. Accordingly, since a dark current amount is acquired by calculating an average value among the output signals of the VOB pixels read by executing addition reading driving similar to that for the valid pixels, the influence of dark current can be suppressed by correcting the output signals of the VOB pixels using this value. For the VOB pixel, the same addition reading driving as that for the valid pixel must be carried out. However, since the dark current correction value can be calculated from all the VOB pixels, highly accurate correction can be achieved without greatly increasing the number of pixels.

The present exemplary embodiment has been described by taking the example where the NULL pixel includes no addition switch 308. However, an addition switch 308 can be included as in the case of the valid pixel. When the NULL pixels are selected to read the outputs by a plurality of times, the number of parameters for the NULL pixel output signal increases, thus enabling correction where the influence of random noise is suppressed more. In the present exemplary embodiment, there is no particular description as to low pixelation in the horizontal direction (in the row direction). However, addition processing can be carried out after reading of the signals of all the pixels, or addition processing can be carried out in the horizontal direction (in the column direction) in the image sensor by a well-known technology.

The processing enables acquisition of a good image without enlarging a circuit size when driving is executed to achieve low pixelation for the output of the image sensor of a high pixel.

Next, another exemplary embodiment of the present invention is described. The second exemplary embodiment is different from the first exemplary embodiment only in a reading method of a NULL pixel (dummy pixel). The configurations of an imaging apparatus and an image sensor according to the second exemplary embodiment are similar to those of the first exemplary embodiment concerning various processes including correction processing performed by using output signals of a NULL pixel (dummy pixel) and a VOB pixel. Description of portions similar to those of the first exemplary embodiment is omitted, and only portions different from the first exemplary embodiment will be described.

As described above in the first exemplary embodiment, the NULL pixel (dummy pixel) is used for calculating the correction value of the fixed pattern noise or the shading for each column. Thus, when the NULL pixels include a defective pixel, an output voltage level of the defective pixel is different from that of a normal NULL pixel, and hence a correct correction value (average value) cannot be acquired. For example, when a reset power voltage VDD is 5V, the output voltage level of the defective pixel is 4.99V, which is lower by 100 mV than the reset power voltage VDD 5V, while the output voltage level of the normal NULL pixel is not so different from the reset power voltage 5V, namely, 4.999 V. Particularly, in the NULL pixel, since not only a correction value is calculated for each column but also the number of pixels (number of rows) that serves as the number of parameters is small, the influence of the defective pixel is large. An example of a defect of the NULL pixel is a case where there is a defect in the SF 305.

Figure 10:
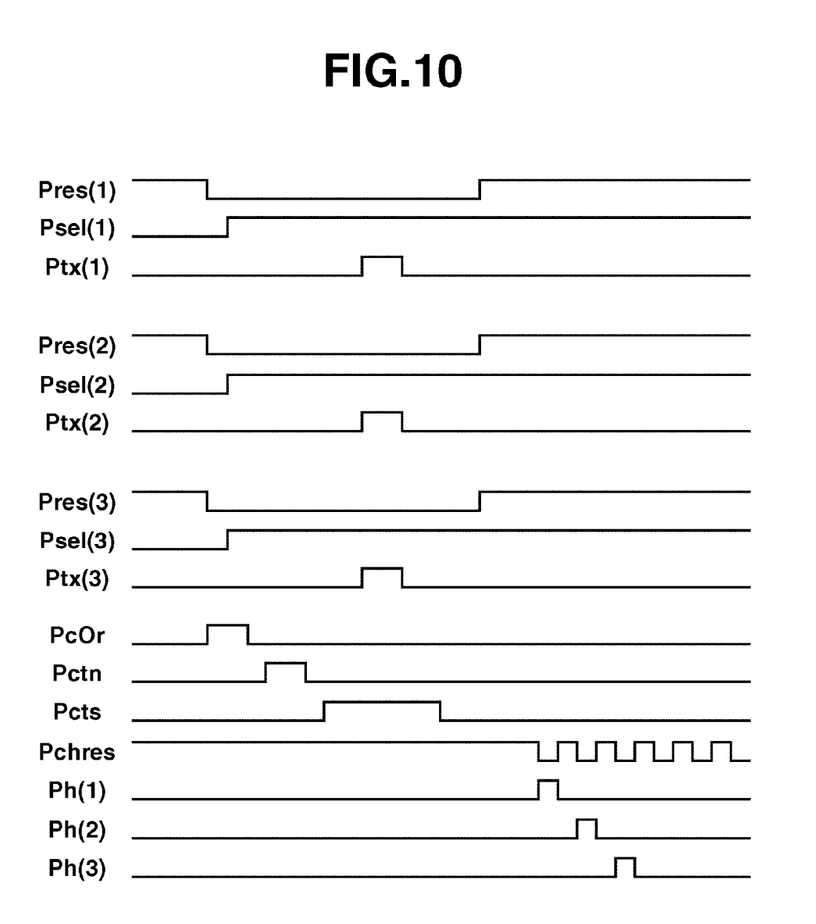
FIG. 10 is a driving timing chart of an image sensor according to a second exemplary embodiment of the present invention.

Thus, according to the second exemplary embodiment, control is executed to simultaneously turn on selection switches 306 of a plurality of pixels during reading. FIG. 10 is a timing chart illustrating reading driving according to the second exemplary embodiment. An example where the first row, the second row, and the third row illustrated in FIG. 8 is set as one group and one of output voltage levels of three pixels in each column is read is described.

First, in a state where a transfer switch 302 is not turned on, second row selection lines Pres (1), Press (2), and Press (3) connected to a gate of a reset switch 303 are set to a high level. This resets a gate of the SF 305 to a reset power supply voltage VDD.

Upon the second row selection lines Pres (1), Press (2), and Press (3) connected to the gate of the reset switch 303 are set to a low level, simultaneously, gate lines PcOr of clamping switches of reading circuits 402 and 410 are set to a high level. Then, third row selection lines Psel (1), Psel (2), and Psel (3) connected to a gate of a selection switch 306 are set to a high level. Accordingly, a reset signal (noise signal) where a reset noise has been superimposed is read from vertical signal lines 408a to 408c to thee terminals Vout of the reading circuits 402 and 410 illustrated in FIG. 5, and clamped to a clamping capacity CO of each column.

Then, after the gate line PcOr of the clamping switch is set to a low level, a gate line Pctn of the noise signal side transfer switch is set to a high level, thus holding a rest signal at a noise holding capacity Ctn of each column.

Then, after a gate line Pcts of the pixel signal side transfer switch is set to a high level, first row selection lines Ptx (1), Ptx (2), and Ptx (3) connected to gates of transfer switches 302 are set to a high level. In other words, a plurality of transfer switches 302 of a 1st to 3rd rows are simultaneously turned on. Since the plurality of transfer switches 302 of the 1st to 3rd rows are simultaneously turned on, output voltages of the three SF 305 of the 1st to 3rd rows compete with one another on a vertical output line 408. When the output voltages of the plurality of different SF 305 compete with one another, the output voltage of the SF 305 that outputs a voltage nearest a reset power voltage 5V becomes a signal value, and is read from the virtual signal line 408 to the terminals Vout of the reading circuits 402 and 410.

Then, after the first row selection lines Ptx (1), Ptx (2), and Ptx (3) connected to the gates of the transfer switches 302 are set to a low level, the gate line Pcts of the pixel signal side transfer switch is set to a low level. An optical signal component (pixel signal) equivalent to a change from the reset signal is then read to be held at a signal holding capacity Cts of each column. Through this operation, among noise signals and pixel signals of the pixels connected to the first row, the second row, and the third row, signals having voltage values nearest the reset power voltage 5V are respectively held at a noise holding capacity Ctn and a signal holding capacity Cts connected to each column.

Then, by signals Ph supplied from horizontal shift registers 406 and 409, horizontal transfer switch gates of each column are sequentially set to a high level. Then, voltages held at the noise holding capacity Ctn and the signal holding capacity Cts are sequentially read to holding capacities Chn and Chs of the horizontal output lines, and subjected to difference processing at a differential amplifier to be sequentially output to the output terminal OUT.

Between signal reading of each of the columns, a reset signal Pchres for turning on the resent switch is set to a high level, and the holding capacities Chn and Chs of the horizontal output lines are respectively reset to reset voltages VCHRN and VCHRS.

As described above, by reading, among the output values of the three pixels arrayed in the column direction of the NULL pixel, the output voltage nearest the reset power voltage VDD 5V, the output of the defective pixel where the output voltage level becomes smaller than the reset power voltage VDD 5V is not read. Thus, accurate correction can be carried out. Further, by selectively reading from the NULL pixel by a plurality of times, the influence of a random noise can be suppressed, and a more correct correction value can be calculated.

Other Embodiments

Aspects of the present invention can also be realized by a computer of a system or apparatus (or devices such as a CPU or MPU) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments. For this purpose, the program is provided to the computer for example via a network or from a recording medium of various types serving as the memory device (e.g., computer-readable medium). In such a case, the system or apparatus, and the recording medium where the program is stored, are included as being within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2011-140970 filed Jun. 24, 2011, which is hereby incorporated by reference herein in its entirety.

What is claimed is:

1. An imaging apparatus comprising:
an image sensor including a pixel array in which a plurality of pixels arranged in a row direction and in a column direction, wherein the pixel array includes an effective pixel area in which a plurality of effective pixels each having a photoelectric conversion unit is disposed, a reference pixel area configured to output a reference signal to correct an output signal of the effective pixel area, and a mixing unit configured to mix outputs of the plurality of pixels in the column direction,
wherein the mixing unit is configured not to mix the outputs of the plurality of the reference pixels in a case where the mixing unit mixes the outputs of the plurality of the effective pixels in the column direction.

2. The imaging apparatus according to claim 1, wherein the reference pixel area includes a first reference pixel area in which a plurality of first reference pixels each having a light-shielded photoelectric conversion unit is disposed, and a second reference pixel area in which a plurality of second reference pixels each having no photoelectric conversion unit is disposed, and wherein the mixing unit is configured to mix the outputs of the plurality of the first reference pixels to read, and not to mix the outputs of the plurality of the second reference pixels to read in a case where the mixing unit mixes the outputs of the plurality of the effective pixels in the column direction.

3. The imaging apparatus according to claim 2, wherein the effective pixel area and the first reference pixel area comprise the mixing unit, while the second reference pixel area does not comprise the mixing unit.

4. The imaging apparatus according to claim 2, wherein the effective pixel and the first reference pixel comprise the photoelectric conversion unit, a floating diffusion area for converting a charge into a voltage, a transfer switch for transferring charges generated at the photoelectric conversion unit to the floating diffusion area, an amplifier for outputting a signal according to the voltage converted by the floating diffusion area, a selection switch for outputting the signal from the amplifier to a column output line, and a reset switch for resetting the floating diffusion area to a reset potential,
wherein the second reference pixel comprises the same components as those of the first reference pixel and the effective pixel excluding the photoelectric conversion unit.

5. The imaging apparatus according to claim 4, wherein when the mixing unit mixes the outputs of the plurality of effective pixels to read, the selection switches of the plurality of the second reference pixels concurrently turn on, and the transfer switches of the plurality of second reference pixels concurrently turn on, during reading of a signal of the second reference pixel area.

6. The imaging apparatus according to claim 1, further comprising a correction unit configured to correct the output signal of the reference pixel area by using the output signals of the effective pixel area.

7. A method for controlling an imaging apparatus including an image sensor in which a plurality of pixels arranged in a row direction and in a column direction, wherein the pixel array includes an effective pixel area in which a plurality of effective pixels each having a photoelectric conversion unit is disposed, a reference pixel area configured to output a reference signal to correct an output signal of the effective pixel area, and a mixing unit configured to mix outputs of the plurality of pixels in the column direction, the method comprising:
reading outputs of the plurality of the reference pixels without mixing the outputs by the mixing unit in a case where the mixing unit mixes the outputs of the plurality of the effective pixels in the column direction.

* * * * *